United States Patent
Gardner et al.

(10) Patent No.: US 6,781,521 B1
(45) Date of Patent: Aug. 24, 2004

(54) FILTERS FOR CANCELING MULTIPLE NOISE SOURCES IN BOREHOLE ELECTROMAGNETIC TELEMETRY SYSTEM

(75) Inventors: Wallace R. Gardner, Houston, TX (US); Paul F. Rodney, Spring, TX (US); Harrison C. Smith, Anna, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 471 days.

(21) Appl. No.: 09/923,185

(22) Filed: Aug. 6, 2001

(51) Int. Cl.[7] .............................................. H03H 7/30
(52) U.S. Cl. .......................... 340/854.4; 340/870.04; 340/870.16; 340/856.3; 333/18; 375/232
(58) Field of Search ......................... 340/856.3, 854.3, 340/854.9, 855.5, 855.4, 870.04, 870.16; 375/232–236; 333/18; 330/304

(56) References Cited

U.S. PATENT DOCUMENTS

| | | | | |
|---|---|---|---|---|
| 4,199,989 A | | 4/1980 | Forward et al. .............. 73/430 |
| 4,215,425 A | | 7/1980 | Waggener .................... 367/83 |
| 4,605,826 A | * | 8/1986 | Kanemasa .................. 370/290 |
| 4,626,894 A | * | 12/1986 | Harwood et al. ............ 346/667 |
| 4,750,156 A | | 6/1988 | Abrams et al. .............. 367/42 |
| 4,878,206 A | | 10/1989 | Grosso et al. ............... 367/83 |
| 4,884,230 A | * | 11/1989 | Gielis et al. ................ 708/318 |
| 4,947,362 A | * | 8/1990 | Bui ............................ 708/322 |
| 5,189,415 A | | 2/1993 | Shimada et al. ........... 340/854.6 |
| 5,274,606 A | | 12/1993 | Drumheller et al. .......... 367/82 |
| 5,289,354 A | | 2/1994 | Clayer et al. ................ 367/82 |
| 5,394,141 A | | 2/1995 | Soulier ...................... 340/854.4 |
| 5,436,564 A | * | 7/1995 | Kreger et al. ............... 600/411 |
| 5,448,531 A | | 9/1995 | Dragoset, Jr. ............... 367/45 |
| 5,473,321 A | | 12/1995 | Goodman et al. ........ 340/854.9 |
| 5,490,121 A | | 2/1996 | Gardner et al. .............. 367/83 |
| 5,555,530 A | | 9/1996 | Meehan ....................... 367/45 |
| 5,565,860 A | | 10/1996 | Sakata et al. ............. 340/854.8 |
| 5,576,703 A | | 11/1996 | MacLeod et al. ......... 340/854.4 |
| 5,627,896 A | | 5/1997 | Southward et al. ........... 381/71 |
| 5,780,784 A | | 7/1998 | Robbins ..................... 181/102 |
| 5,815,496 A | * | 9/1998 | Flanagan et al. ........... 370/287 |
| 5,841,810 A | * | 11/1998 | Wong et al. ................ 375/232 |
| 5,969,638 A | | 10/1999 | Chin ....................... 340/855.3 |
| 5,978,417 A | * | 11/1999 | Baker et al. ................ 375/232 |
| 6,023,658 A | | 2/2000 | Jeffryes ....................... 702/16 |
| 6,094,623 A | | 7/2000 | Mintchev et al. ............. 702/85 |
| 6,188,223 B1 | | 2/2001 | Van Steenwyk et al. ..... 324/370 |
| 6,208,265 B1 | * | 3/2001 | Smith ...................... 340/854.6 |
| 6,434,247 B1 | * | 8/2002 | Kates et al. ................ 381/312 |
| 6,657,597 B2 | * | 12/2003 | Rodney et al. ............. 343/719 |

\* cited by examiner

*Primary Examiner*—Albert K. Wong
(74) *Attorney, Agent, or Firm*—Conley Rose, P.C.

(57) ABSTRACT

An electromagnetic borehole telemetry system providing improved signal to noise ratio. Adaptive filters use noise channels as references to remove noise from the signal channel. Multiple noise channels are coupled to series connected adaptive filters for removing each noise source from the signal channel. The order of noise removal is selected to remove the most significant first.

13 Claims, 9 Drawing Sheets

Figure 2 Adaptive Noise Canceller

Figure 3  Noise Canceller for EM Telemetry System

Figure 4 Transversal Filter.

Figure 5 'Filter tap coefficient algorithm.

Figure 6 Steering the magnetometer to the common noise source.

Figure 7 Signal enhancement with beam steering

FILTERS FOR CANCELING MULTIPLE NOISE SOURCES IN BOREHOLE ELECTROMAGNETIC TELEMETRY SYSTEM

CROSS-REFERENCE TO RELATED APPLICATIONS

This application is related to U.S. patent application Ser. No. 09/923,184, entitled "Motion Sensor for Noise Cancellation in Borehole Electromagnetic Telemetry System", filed on the same date as this application by the present inventors and assigned to the same assignee, which is hereby incorporated by reference for all purposes.

This application is related to U.S. Pat. No. 6,657,597, issued on Dec. 2, 2003, entitled "Directional Signal and Noise Sensors for Borehole Electromagnetic Telemetry System", by the present inventors and assigned to the same assignee, which is hereby incorporated by reference for all purposes.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

This invention relates to a borehole electromagnetic telemetry system, and in particular to filters which use multiple noise references to cancel noise in the signal channel.

BACKGROUND OF THE INVENTION

Without limiting the scope of the invention, its background is described in connection with transmitting downhole data to the surface during measurements while drilling (MWD), as an example. It should be noted that the principles of the present invention are applicable not only during drilling, but throughout the life of a wellbore including, but not limited to, during logging, testing, completing and production. The principles are also applicable to transmission of signals from the surface to downhole equipment.

Heretofore, in this field, a variety of communication and transmission techniques have been attempted to provide real time data from the vicinity of the bit to the surface during drilling. The utilization of MWD with real time data transmission provides substantial benefits during a drilling operation. For example, continuous monitoring of downhole conditions allows for an immediate response to potential well control problems and improves mud programs.

Measurement of parameters such as bit weight, torque, wear and bearing condition in real time provides for more efficient drilling operations. In fact, faster penetration rates, better trip planning, reduced equipment failures, fewer delays for directional surveys, and the elimination of a need to interrupt drilling for abnormal pressure detection is achievable using MWD techniques.

At present, there are four major categories of telemetry systems that have been used in an attempt to provide real time data from the vicinity of the drill bit to the surface; namely, mud pressure pulses, insulated conductors, acoustics and electromagnetic waves.

In a mud pressure pulse system, the resistance of mud flow through a drill string is modulated by means of a valve and control mechanism mounted in a special drill collar near the bit. This type of system typically transmits at 1 bit per second as the pressure pulse travels up the mud column at or near the velocity of sound in the mud. It is well known that mud pulse systems are intrinsically limited to a few bits per second due to attenuation and spreading of pulses.

Insulated conductors, or hard wire connection from the bit to the surface, is an alternative method for establishing downhole communications. This type of system is capable of a high data rate and two way communication is possible. It has been found, however, that this type of system requires a special drill pipe and special tool joint connectors which substantially increase the cost of a drilling operation. Also, these systems are prone to failure as a result of the abrasive conditions of the mud system and the wear caused by the rotation of the drill string.

Acoustic systems have provided a third alternative. Typically, an acoustic signal is generated near the bit and is transmitted through the drill pipe, mud column or the earth. It has been found, however, that the very low intensity of the signal which can be generated downhole, along with the acoustic noise generated by the drilling system, makes signal detection difficult. Reflective and refractive interference resulting from changing diameters and thread makeup at the tool joints compounds the signal attenuation problem for drill pipe transmission.

The fourth technique used to telemeter downhole data to the surface uses the transmission of electromagnetic waves through the earth. A current carrying downhole data signal is input to a toroid or collar positioned adjacent to the drill bit or input directly to the drill string. When a toroid is utilized, a primary winding, carrying the data for transmission, is wrapped around the toroid and a secondary is formed by the drill pipe. A receiver is connected to the ground at the surface where the electromagnetic data is picked up and recorded. It has been found, however, that in deep or noisy well applications, conventionals electromagnetic systems are unable to generate a signal with sufficient intensity to be recovered at the surface.

In general, the quality of an electromagnetic signal reaching the surface is measured in terms of signal to noise ratio. As the ratio drops, it becomes more difficult to recover or reconstruct the signal. While increasing the power of the transmitted signal is an obvious way of increasing the signal to noise ratio, this approach is limited by batteries suitable for the purpose and the desire to extend the time between battery replacements. It is also known to pass band filter received signals to remove noise out of the frequency band of the signal transmitter. These approaches have allowed development of commercial borehole electromagnetic telemetry systems which work at data rates of up to four bits per second and at depths of up to 4000 feet without repeaters in MWD applications. It would be desirable to transmit signals from deeper wells and with much higher data rates which will be required for logging while drilling, LWD, systems.

SUMMARY OF THE INVENTION

The present invention provides apparatus which improves the signal to noise ratio in an electromagnetic telemetry system which telemeters data between a borehole and the surface of the earth. A receiver includes a noise canceller which uses a reference noise channel to remove noise from a received signal. In a system with multiple noise sensors and noise channels, a plurality of noise cancellers are used, with each canceller using one of the noise channels to remove noise from the signal channel. In a preferred form, the cancellers include adaptive filters and the filters are connected in series.

DETAILED DESCRIPTION OF THE INVENTION

Figure 1:
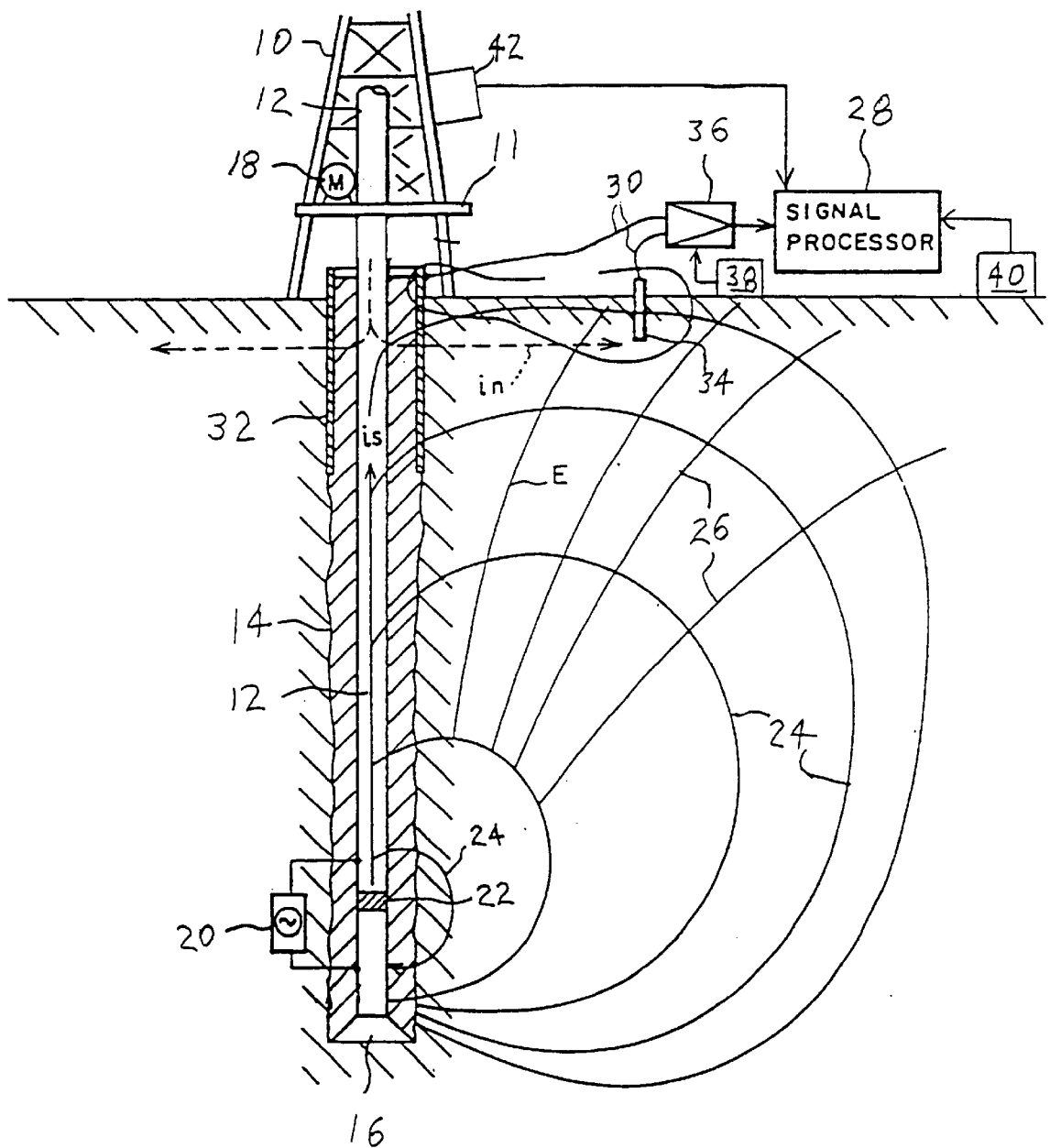
FIG. 1 is an illustration of an oil well drilling rig and a wellbore electromagnetic telemetry system in use while a well is being drilled.

With reference to FIG. 1, a wellbore electromagnetic, EM, telemetry system will be described. A drill rig 10 is shown driving a drill pipe 12 in a wellbore 14. The drill pipe 12 has a drill bit 16 on its lower end. A motor 18 on the rig 10 represents an electric motor which may rotate the drill pipe 12 and also represents other motors which would be used, e.g. to pump mud through the drill pipe 12. The drilling mud may be used to drive a mud motor located just above drill bit 16.

An electronics package 20 is positioned within the drill pipe 12 near drill bit 16. The electronics package includes sensors for measuring parameters, such as pressure and temperature, and a transmitter for telemetering the information to the surface location of the well. Any means of transmitting an electromagnetic signal may be used. In this figure, the package 20 is shown driving an electric current into two sections of drill pipe 12 separated by an insulating section 22. Alternatively a toroidal core may be positioned around drill pipe 12 and the package 20 may drive a winding on the core to generate an equivalent transmitted electromagnetic signal. The toroidal core is usually an integral part of a section of drill pipe or a drill collar to protect the core from damage.

A transmitted electromagnetic signal is represented by lines of current 24 and equipotential lines 26. This signal is detected at the surface location of the well and coupled to a signal processor 28. The signal may be detected in several ways. Electrical connections 30 may be made between a surface casing 32 and an electrode 34 implanted into the surface of the earth some distance from the casing 32. The electric field (E field) of the transmitted signal produces a voltage between casing 32 and electrode 34. This E field detector may be considered a directional antenna which detects a horizontal component of a potential difference arising from the electric field of an EM signal. This potential difference may be amplified by an amplifier 36 and then coupled to signal processor 28.

The magnetic field component of the transmitted EM signal 24, 26 may also be detected. A magnetometer 38 may be positioned in a location selected to receive the transmitted EM signal. The detected magnetic field may be coupled to amplifier 36 and used as the signal channel, or may be combined with the electrical signal from lines 30.

In the preferred embodiments, a plurality of sensors are used to detect various noise sources which generate EM noise. There are a number of sources of EM noise which is also detected by the signal sensors, e.g. sensor 38, and which therefore reduces the signal to noise ratio of the signal channel coupled to signal processor 28. The outputs from the various noise sensors are referred to herein as noise channels. It is preferred that the noise channels contain none of the signal transmitted from the transmitter package 20.

A plurality of noise sensors 40 may be positioned at various distances from the drill rig 10. Physical spacing tends to reduce the amount of transmitted signal detected by sensors 40. The sensors 40 may be positioned near sources of noise such as power lines, motors, generators, and pipelines to more effectively detect noise from such sources. At least one sensor may be placed away from such manmade noise sources to detect magnetotelluric noise. In a preferred embodiment, the sensors 40 are magnetometers or include a magnetometer and an electrical field or current detector. In a more preferred embodiment, the sensors 40 include three-axis magnetometers and beam steering means, as described in detail below. By proper selection of sensor type and by proper positioning, physically or by beam steering, the sensors can provide a noise channel with minimum signal.

One or more sensors 42 may be mounted on the drill rig 10 to detect noise. These sensors may include current detectors for detecting drive currents in motors such as motor 18 or output currents of electrical generators which provide current to the motors. The sensors 42 may preferably include magnetometers as discussed above. In one embodiment, sensors 42 may include motion sensors, e.g. seismometers, which detect physical motion, e.g. vibration, in various parts of the drill rig 10 and equipment which drives the drill pipe 12. The sensors 42 may be attached to structural members of rig 10 or placed on floor members 11. In addition, sensors 42 may be coupled to the earth near support members of rig 10 to detect earth motion induced by the rig 10.

As discussed above, the signal processor 28 receives a signal channel from amplifier 36 and also receives one or more noise channels from various noise detectors 40 and 42. As discussed in the background section above, the processor 28 may include bandpass filters on all channels which block all signals outside the frequency band in which the EM transmitter 20 operates. In addition, the processor 28 includes one or more noise cancellers which, by reference to the noise channels, remove noise from the signal channel.

Figure 2:
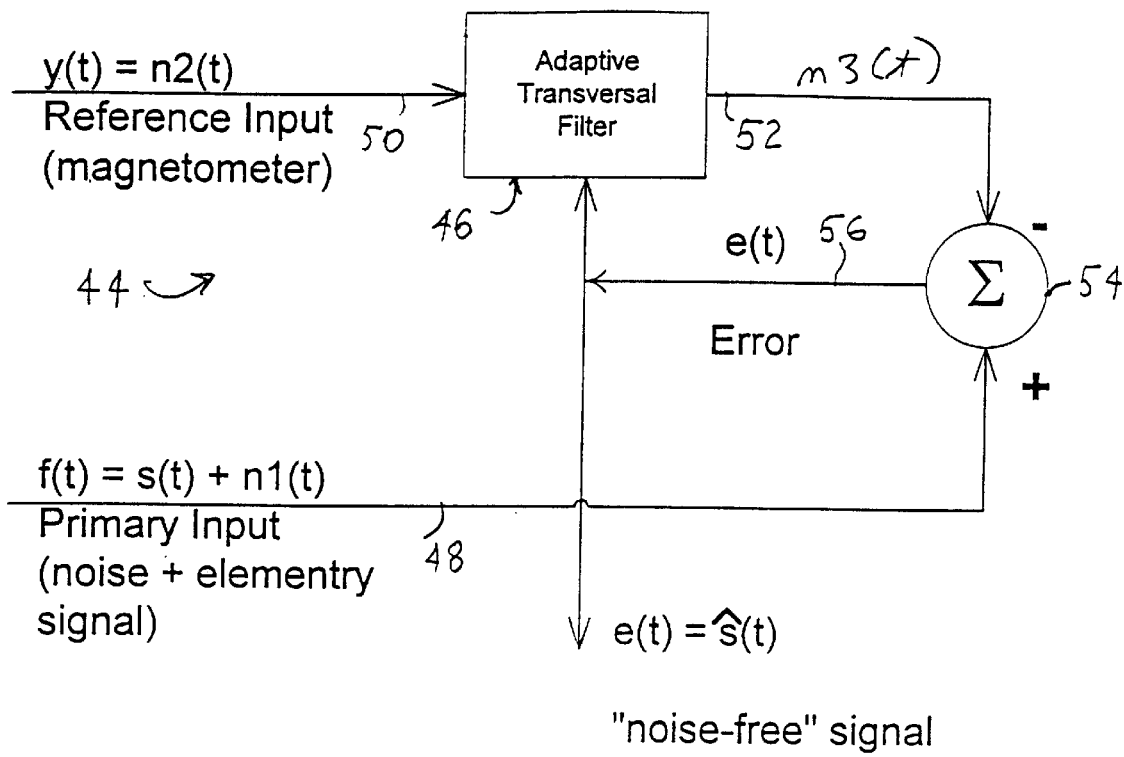
FIG. 2 is a block diagram of an adaptive filter used to remove noise from a received electromagnetic signal.

With reference to FIG. 2, a preferred noise canceller 44 will be described. A preferred noise canceller 44 includes an adaptive transversal filter 46. The canceller 44 has two inputs, a primary, i.e. signal channel, input 48 and a reference, i.e. noise channel, input 50. The adaptive filter 46 has a reference input forming the reference input 50 of the noise canceller 44 and has an output 52 providing an approximation of the noise contained in the signal on canceller 44 input 48. The canceller 44 also includes an adder 54 which removes the estimated noise on filter 46 output 52 from the primary input on line 48 to form an error signal e(t) on line 56. The error signal is fed back to filter 46 and also forms the output of canceller 44 which is a noise free signal, or at least an approximation thereof, having improved signal to noise ratio.

For best results, the noises in the primary input 48 and in the reference input 50 must be correlated and the reference input should be free of the signal. The object is to use the reference input to reduce the noise in the primary input. To the extent that the noise channel includes desired signal, the canceller will cancel part of the signal.

For the purpose of illustration, assume that the primary input 48 is the up link electric field signal received by an EM telemetry system through leads 30 (FIG. 1) and that this signal has been corrupted by noise induced by rotation of drill pipe 12. This signal therefore has the following form:

$$f(t)=s(t)+n1(t)$$

where the received signal, f(t), is the sum of the electric field component of the telemetry signal, s(t), plus the electric field noise component, n1(t), induced, for example, by drillstring 12 rotation. The primary signal may be sampled at regular intervals, T, and digitized to produce the following discrete-time signal:

$$f_i=s_i+n1_i,$$

where i refers to the sample number, from an arbitrary time origin, common to all measurements.

The reference input may be expressed in discrete time as:

$$y_i=n2_i$$

Where $n2_i$ is the reference noise signal which is assumed to be correlated with the primary noise signal, n1(t), corrupting the telemetry signal. This noise reference can be obtained using a magnetometer or an electric field sensor at a point sufficiently removed from the location where the primary signal is received so that there is no appreciable component of the telemetry signal in it. The correlation between n2 and n1 can be exploited to minimize the noise in the primary input. In general, the exact nature of this correlation need not be known in advance for this noise cancellation method to work.

With this notation, noise cancellation is seen to be simply the joint process estimation problem whose structure is shown in FIG. 2. The adaptive joint process estimation algorithm will be able to exploit the correlation between the two input signals to minimize the mean-square error, E[e(t)$^2$], between f(t) and an estimator of the noise, n3(t), where:

$$e(t)=f(t)-n3(t)$$

or in discrete form, $$e_i=f_i-n3_i$$

Taking into account the assumption that n2(t), and hence n3(t), are uncorrelated with s(t), $$E[e(t)]=E[s(t)]+E[(n1(t)-n3(t))]$$

or $$E[e_i]=E[s_i]+E[(n1_i-n3_i)]$$

where E[ ] a denotes expected value of the quantity in brackets [ ]. Adjusting the adaptive filter such that the mean squared value of $E[e_i]$ is minimum results in n3(t) being the best estimator of n1(t).

In its simplest embodiment, this invention uses an adaptive filter to approximate the transfer function between a reference electromagnetic noise signal picked up by a magnetometer, e.g. sensor 40 of FIG. 1, and electromagnetic noise contaminating the telemetry signal by minimizing the mean-squared error between them. The telemetry noise approximation derived from an adaptive filter is subtracted from the noisy telemetry signal to get a "noise-free" telemetry signal, or at least a signal with improved signal to noise ratio.

Figure 3:
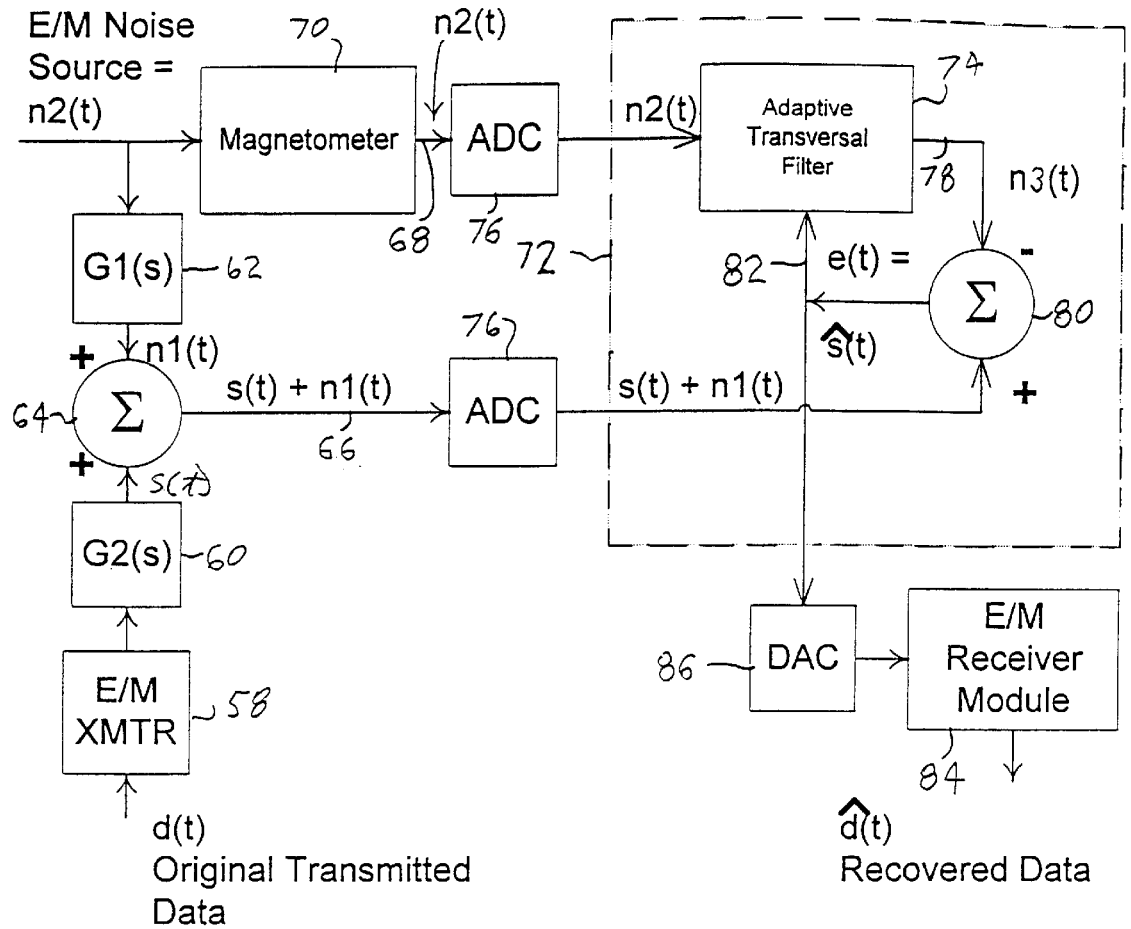
FIG. 3 is a more detailed block diagram of the filter of FIG. 2 and a model of signal and noise transmission paths.

FIG. 3 provides a more detailed block diagram of an EM telemetry system and a model of signal and noise channels. Original data, d(t), is digitized, encoded, modulated and then radiated as a telemetry signal into the earth-pipe electromagnetic transmission channel by the electromagnetic transmitter (E/M XMTR), 58, e.g. part of the electronics package 20 of FIG. 1. The electromagnetic telemetry signal is transmitted uphole via the earth-pipe transmission channel where it is picked up as a difference signal between the borehole casing 32 at the surface and earth electrode 34 (FIG. 1). The earth-pipe-electrode transmission channel 60 is represented as a transfer function G2(s) which results in a signal s(t) being received at the surface location. The telemetry signal detected by the electrodes at the surface is contaminated by electromagnetic noise sources near the surface such as machinery (primarily on the drilling rig) and power lines. The transfer path 62 between the reference noise source, n2(t), and the telemetry noise, n1(t), is denoted as transfer function G1(s) which results in noise n1(t) reaching the signal detector. In FIG. 3, an adder 64 is used to model the combination of the transmitted data d(t) and the EM noise source n2(t) to form the signal channel 66, s(t)+n1(t), which is the primary input to the noise canceller. The combination actually occurs because the signal sensor, e.g. the voltage detected between casing 32 and electrode 34, detects both the signal, s(t), and noise, n1(t).

The output 68 of a magnetometer 70 forms the noise channel or reference input, n2(t), into a noise canceller 72 including an adaptive filter 74. Both the signal channel 66 and noise channel 68 may be converted to digital form by analog to digital converters 76. The adaptive filter 74 transforms the reference noise signal, n2(t), into an approximation n3(t) of the telemetry noise n1(t) at its output 78. The difference between the filter's output 78 and the noisy telemetry signal 66 is produced by subtractor 80 and is used as the error signal, e(t), into the adaptive filter input 82, which also forms the output of the canceller 72. The adaptive filter minimizes the error signal by adjusting its output to be as close an approximation (in the mean square sense) to the noisy telemetry signal as possible. Since the reference noise input, n2(t), is a function of the telemetry noise, n1(t), but not a function of the telemetry signal, s(t), and since the signal and noise are not correlated, the filter can only force the reference to approximate the telemetry noise, but not the telemetry signal. The result of the process is that the error signal, e(t), is an approximation of a noise free signal s(t). This improved signal, i.e. the approximation of a noise free signal s(t), is coupled to a receiver module 84 for further processing to reconstruct the original transmitted data d(t). If the signals into noise canceller 72 were converted from analog to digital form by converters 76, a digital to analog converter 86 may be used to convert the output 82 of canceller 72 back to analog form for receiver 84.

Figure 4:
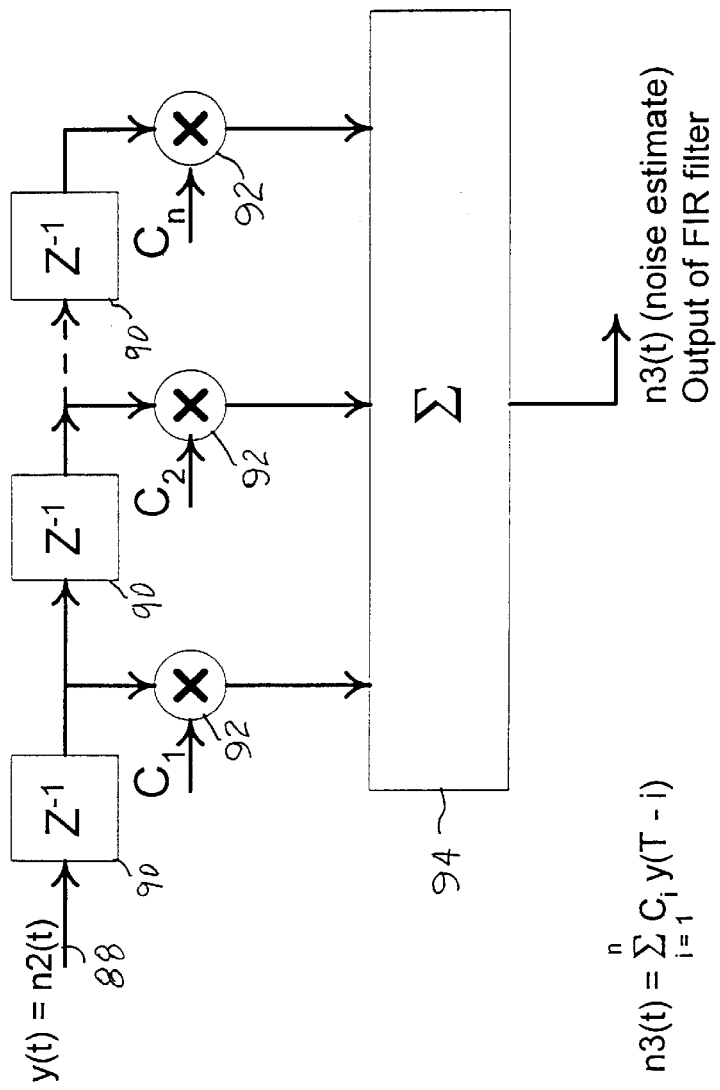
FIG. 4 is a block diagram illustrating the structure of an adaptive transversal filter.

FIG. 4 provides a schematic of the adaptive filter 74 of FIG. 3. The digitized input signal 88 (e.g. a noise channel from a magnetometer) is run through a series of unit time delays 90 of T seconds, each designated as $Z^{-1}$. The signals are "tapped off" after unit time delay and each multiplied in multipliers 92 by unique filter tap coefficients $C_1, C_2, \ldots, C_n$. The output of the filter is formed by summing together the gain-adjusted tap signals at the outputs of multipliers 92 in summer 94. The filter's transfer function is determined by the value of the filter's tap coefficients. The filter's transfer function is adapted by changing the values of the filter tap coefficients $C_1, C_2, \ldots, C_n$.

Figure 5:
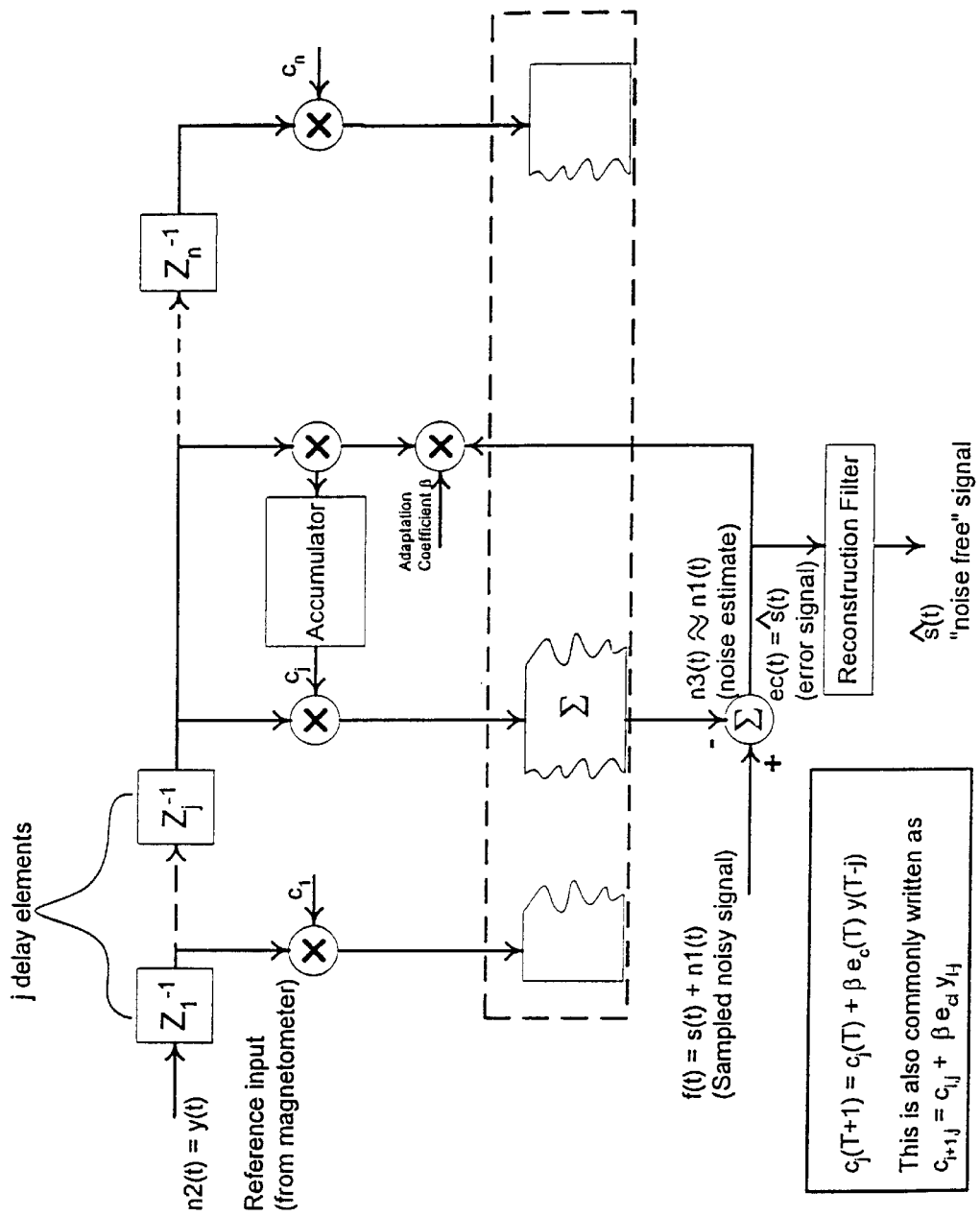
FIG. 5 is a block diagram illustrating a filter tap coefficient algorithm for the filter of FIG. 4.

FIG. 5 shows the filter's adaptation algorithm for one of the filter's coefficients. The tap coefficients are updated after every "shift" (every T seconds) of the digitized reference signal through the filter's tapped delay line. The coefficient at the $j^{th}$ tap is updated by a value equal to the respective tap signal, y(T−j) times the canceller's digitized error signal, e(T), times a small adaptation coefficients, β. The adaptation algorithm may be represented by the following equation:

$$cj_{i+T} = cj_T + \beta \cdot e \cdot y_{i-j}$$

For an adaptive filter to work best, the noise reference, or noise channel, would contain only noise and not contain any of the desired signal. In real systems, some of the desired signal will be detected by any EM detector used for detecting a noise source. Prior systems place noise detectors near noise sources to improve the noise channel, i.e. increase the noise to signal ratio in the noise channel. In similar fashion, the noise canceller will work better if the signal channel has as little noise in it as possible, i.e. there will be less noise to remove. As with noise detectors, it is known to select positions for signal detectors where the maximum signal will be detected and the minimum noise will be detected. In certain embodiments of the present invention, one or more magnetometers are preferred for detecting EM signal and/or noise. A three-axis magnetometer and beam steering techniques may be used to provide a noise channel with minimum signal content and/or a signal channel with minimum noise content. A three-axis magnetometer is essentially a set of three magnetometers positioned orthogonally to each other with each magnetometer having a separate electrical output representing the magnetic field in its respective direction.

Both the transmitted EM signal and noise originate as vector fields. It is possible to receive three different components of each field, electric and magnetic, and use these components to fully identify the vector. In a preferred embodiment, the electric field would be measured as shown in FIG. 1. Each of the detectors 40 and 42 would include a three-axis magnetometer which measures three components of the magnetic field, two components being parallel to the surface of the earth, and the third component being orthogonal to the surface of the earth. Call these three components $H_x$, $H_y$, and $H_z$ respectively.

As an example of the use of these components, suppose the downhole EM telemetry transmitter, e.g. package 20 of FIG. 1, is an electric field type of transmitter and suppose the wellbore is nearly vertical. Two techniques are commonly employed in the operation of E-field transmitters. In one of the techniques, an electric current is launched into the formation and into the drill pipe using a toroidal coil wound around a section of the drill collar. The other technique is to apply a voltage across an insulating gap. In either case, a current is launched along the drillstring and into the formation. The component of the magnetic field of the received signal at the earth's surface arising from the current launched into the drillstring is parallel to the earth's surface. This is because the top of a borehole is always orthogonal to the earth's surface, the current flows in the direction of the borehole, and the magnetic field due to a current is orthogonal to its direction of flow. When the portion of the well in which the transmitter is situated is vertical, the magnetic field received at the earth's surface which has propagated through the earth will also tend to be parallel to the earth's surface. This is because the field propagating through the earth will resemble that due to an electric dipole transmitter with the dipole axis oriented along the borehole axis. In this case, the magnetic field is always orthogonal to the dipole axis, and thus parallel to the earth's surface. It is clear in this case that the in-band, horizontal plane magnetic signals can be used to enhance the telemetry signal picked up using an electric field sensor, while the vertical component of the magnetic field, $H_z$, can serve as a noise reference, assuming a source of electric field noise is correlated with the vertical component of the magnetic field, independent of the signal. A single three-axis magnetometer can be used in this case. The vertical component of the magnetic field serves as the noise channel while some linear combination of the electric field and the horizontal components of the magnetic field serves as the signal channel.

If the electric field detector is sufficient for the signal channel, a single, vertically oriented magnetic receiver can be used for the noise channel in such an application. A single vertical magnetometer tends to not detect the signal because its magnetic field is horizontal, so that its output would be primarily due to noise sources. Thus, when the direction of the magnetic field component of an EM signal or noise is known, or predictable, a single magnetometer physically positioned to provide a signal channel or a noise channel is a preferred detector. In onshore, i.e. on land, drilling operations, the electrical component of the transmitted EM signal is usually stronger, whereas in offshore drilling the magnetic component of the transmitted signal is usually stronger. Therefore, it is preferred to use a magnetometer as a noise detector onshore and as a signal detector offshore.

In many cases, the magnetic fields produced by the EM transmitter and various noise sources will not be aligned as discussed above. That is, the transmitted signal may produce a magnetic field which is not exactly horizontal, e.g. when drilling deviated holes. Likewise, some sources of electric field noise will produce magnetic field noise having a predominately horizontal component. This leads to two sensor arrangements, either or both of which may be used in embodiments of the present invention. Generally, these two arrangements both use a three-axis magnetometer and beam steering of the three outputs of the magnetometer. In a first case, the beam steering is used to align the detector with a noise source and, in a second case, it is used to align with the signal source. A single three-axis magnetometer may be used for both purposes simultaneously.

In the first case, all three outputs of a three-axis magnetometer may respond only to the noise, or at least much more noise than signal, if the magnetometer is sufficiently remote from the telemetry system and the origin of the noise is not local to the E-field receiver (if it is, the E-field receiver should be moved). The magnetometer outputs can be combined into a single signal which effectively simulates a single-axis magnetometer oriented in the direction of the noise. This output can be used as a noise reference or noise channel, as described earlier.

In the second case, all three outputs of a three-axis magnetometer may respond primarily to the signal. The magnetometer outputs can be combined into a single signal which effectively simulates a single-axis magnetometer oriented in the best direction for reception of the signal. The electric field signal can be used as a reference for steering a three-axis magnetometer, and can be further combined with the magnetometer output as an additional signal processing step.

The procedure of combining the magnetometer outputs to simulate a single axis magnetometer for these two cases is referred to as "beam steering." Specific examples of beam steering a three axis detector to provide improved noise and signal channels are provided below.

Beam Steering Magnetometer in Direction of Noise

Figure 6:
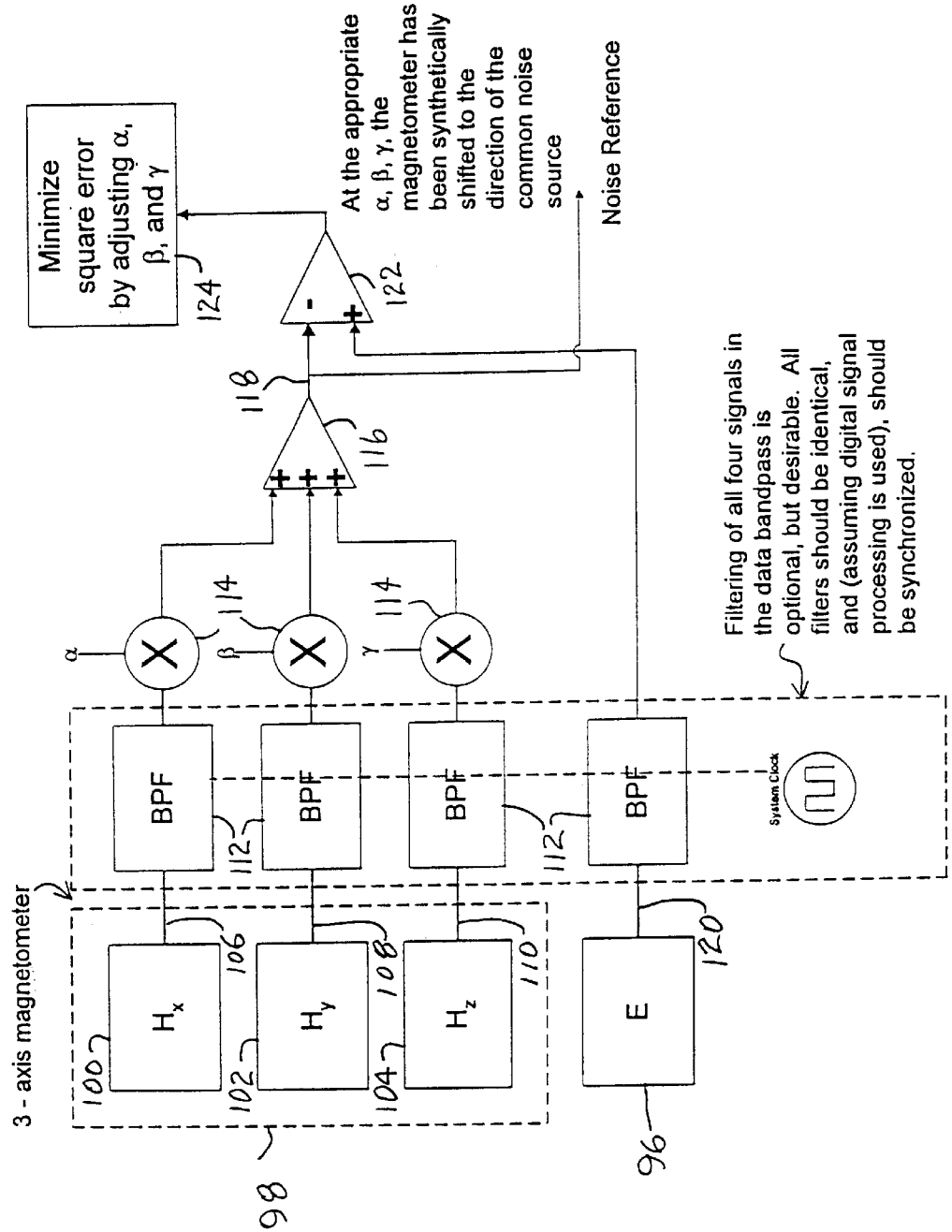
FIG. 6 is a block diagram of a three-axis magnetometer and apparatus for beam steering the magnetometer to alignment for optimal reception of electromagnetic radiation from a noise source.

FIG. 6 illustrates the apparatus and method used for beam steering a detector in the direction of EM radiation from a noise source for the first case. In this figure the EM telemetry system uses an E field detector 96, e.g. casing 32 and electrode 34 of FIG. 1, to detect the signal transmitted by an EM transmitter, e.g. electronics package 20 of FIG. 1. A noise channel is provided by a three-axis magnetometer 98 comprising magnetometers 100, 102 and 104, positioned orthogonally to each other. The outputs 106, 108 and 110 of the magnetometers 100, 102 and 104 are coupled through filters 112 to multipliers 114 where they are multiplied by coefficients $\alpha$, $\beta$, and $\gamma$. The outputs of the multipliers 114 are combined in adder 116, which provides a noise channel at its output 118. The output 120 of signal detector 96 is also coupled through a filter 112 to the positive input of an adder 122. The noise channel 118 is coupled to the negative input of adder 122. The output of adder 122 is the input to an algorithm represented by box 124, which produces the coefficients $\alpha$, $\beta$, and $\gamma$ which are coupled to the multipliers 114.

A least squares technique is used to determine three coefficients, $\alpha$, $\beta$, and $\gamma$, such that:

$$\alpha \cdot H(\text{band\_pass\_filtered})_x + \beta \cdot H(\text{band\_pass\_filtered})_y + \gamma \cdot H(\text{band\_pass\_filtered})_z \approx E(\text{band\_pass\_filtered})$$

Given that the magnetic field measurements do not contain the signal (or contain much more noise than signal), this effectively points the magnetometer toward the noise. To see why this is so, consider a noise source $\vec{N}$ coming from a specific direction $\hat{n}$, where $|\hat{n}|=1$, and consider a signal derived from the three magnetometer outputs given by $$z = a \cdot H_x + b \cdot H_y + c \cdot H_z$$

At what values of a, b, and c will the magnitude of z be maximized? Note that If $\hat{n}$ is of the form $$\hat{n} = \alpha \cdot \hat{i} + \beta \cdot \hat{j} + \gamma \cdot \hat{k}$$

then $$z = (a \cdot \alpha + b \cdot \beta + c \cdot \gamma) \cdot |\vec{R}|$$

or $$z = \vec{A} \cdot \hat{n} \cdot |\vec{N}|$$

where $\vec{A} = a \cdot \hat{i} + b \cdot \hat{j} + c \cdot \hat{k}$

By one of the basic properties of the inner product, this is maximized when $\vec{A}$ is aligned with $\hat{n}$.

The fitting of this combined output to the electric field signal guarantees that the magnetometer is steered toward the common noise source to which both instruments are responding. That is, at the appropriate values of $\alpha$, $\beta$, and $\gamma$, the three-axis magnetometer is synthetically shifted to the direction of the common noise source. In preliminary testing of this concept, a simple linear least squares fit of the three magnetometer outputs over about 10 seconds of data was sufficient to determine the coefficients $\alpha$, $\beta$, and $\gamma$. This is preferably done at a time when the downhole transmitter is not operating.

The bandpass filters 112 of FIG. 6 are optional, but desirable. If they are used, they should be identical. In addition, any signal sampling should be synchronized for all four signals. The output 118 of this system can be treated as a noise reference and used with an adaptive noise canceller as discussed above. Alternatively, the three output signals from the magnetometer can first be processed using an adaptive noise canceller, and the resulting three noise estimators can then be synthetically steered to optimize reception of the noise.

Beam Steering Magnetometer in Direction of Signal

Figure 7:
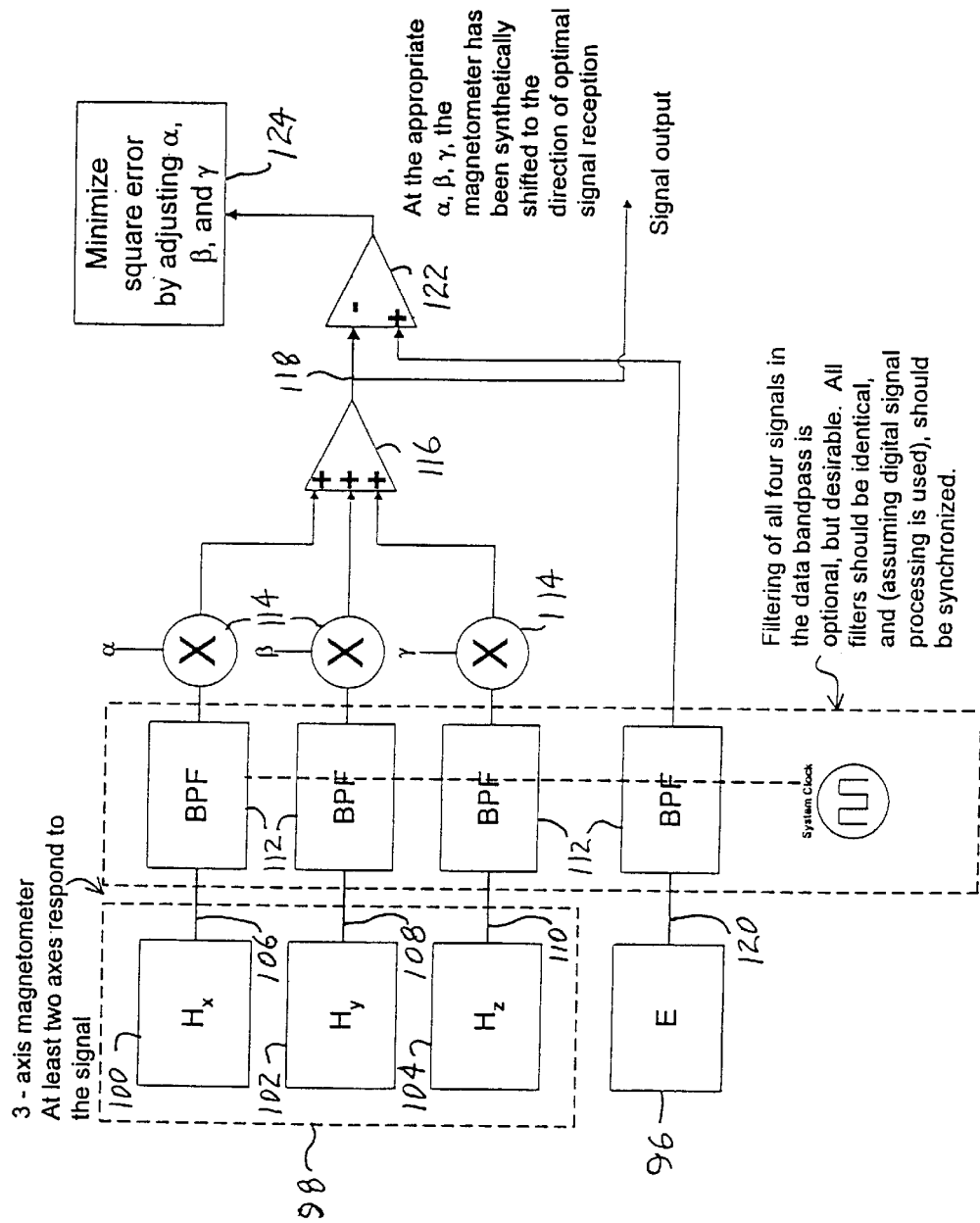
FIG. 7 is a block diagram of a three-axis magnetometer and apparatus for beam steering the magnetometer to alignment for optimal reception of a telemetry signal generated downhole.

FIG. 7 illustrates apparatus which may be used for steering the outputs of a three axis detector in the direction of signal. The apparatus may be identical to the apparatus of FIG. 6 and the same reference numbers are therefore used to identify the various parts. The main difference between FIG. 6 and FIG. 7 is in the positioning of the three-axis magnetometer 98. In FIG. 6 the magnetometer 98 is positioned to detect primarily noise, but in FIG. 7, it is positioned to detect primarily signal in at least two of the magnetometers 100, 102 and 104. As in FIG. 6, the E field detector 96 of FIG. 7 detects the transmitted telemetry signal.

Two methods can be employed to effectively steer an output derived from a three axis magnetometer in the direction of the signal. In the first method, the adder 122 and the algorithm 124 are not needed. Instead, the coefficients $\alpha$, $\beta$, and $\gamma$ are treated as direction cosines and calculated based on the anticipated arrival direction of the transmitted telemetry signal. The arrival direction of the signal does not necessarily correspond with the direction from the magnetometer package to the signal source, i.e. more than simple geometric calculations are required. The arrival direction is the direction of the magnetic field lines at the earth's surface arising from the EM telemetry transmitter. This direction can be estimated analytically using Maxwell's equations given the location of the source, its orientation and the location of the magnetometer package. In the above discussion of use of a magnetometer (without beam steering) to detect noise, it was assumed that for an Electric Field transmitter oriented vertically, the magnetic field will be in the horizontal plane. A more detailed analysis reveals that the magnetic field lines arising from the transmitter will, at the earth's surface, point along the tangent to a circle, the center of which is at the vertical projection of the transmitter to the surface, the circumference of which passes through the magnetometer package, and the tangent of which is projected from the magnetometer package.

A second method of steering the three-axis magnetometer may be used when the magnetometer signals are not significantly affected by noise correlated with the noise detected by the electric field sensor, i.e. when they detect primarily signal. In this case, the magnetometer can be steered in the direction of greatest correlation with the electric field sensor, which will be the direction of best signal detection. The technique for doing this is the same as the algorithm described above with respect to FIG. 6. The algorithm causes the alignment of the magnetometer 98 with signal in this case because the magnetometer is detecting primarily signal. Some further noise improvement can be achieved by adding the signal output of FIG. 7 with the E-field signal since random components will tend to cancel each other.

In some cases it is possible to use one three-axis magnetometer 98 and two sets of multipliers 114, each having a different set of coefficients α, β, and γ to provide both a signal channel and a noise channel. This can occur when the detector is positioned so that the detector responds primarily to signal in one direction and primarily to noise in another. Normally this will require prior knowledge of relative locations of the signal transmitter, the noise source and the detector. Then basic geometric calculations can be made to obtain the appropriate coefficients α, β, and γ for signal channel and for the noise channel.

The location of the transmitter is normally known, so that it is relatively simple to estimate the direction of signal fields. When it is known, but the location of the noise source is not known, the noise source direction can be measured using the method of FIG. 6 when the transmitter is not operating.

A very simple case of selecting beam steering coefficients occurs when the signal magnetic fields are horizontal and the noise fields are vertical. In that case, which was discussed above, the vertical magnetometer, $H_z$, would be used only for the noise channel. This is equivalent to setting the coefficients α, and β to zero for the noise channel. Some combination of the two horizontal magnetometers would provide the signal channel. This is equivalent to setting the coefficient γ to zero and selecting appropriate values for α, and β to provide a signal channel.

While the embodiments shown in FIGS. 6 and 7 include a magnetometer as a three-axis detector, directional E field detectors, i.e. antennas, could also be used. The antenna could be a single direction antenna aligned with the signal or noise E field or could be a three-axis antenna. As with the three-axis magnetometer, a three-axis antenna would comprise three directional antennas positioned orthogonally to each other and would provide three outputs. The above described beam steering techniques apply to such E field detectors. Such antennas may be particularly useful as a noise detector in offshore applications where it is preferred to use a magnetometer, single or three-axis, as the signal detector. They may be useful for signal detection in onshore applications where the signal us usually more easily detected as an E field.

The various magnetometer detectors discussed above provide the advantage of a signal channel with minimum noise and/or a noise channel with minimum signal. Such improved signal and noise channels provide improved inputs to a noise canceller, e.g. canceller 72 of FIG. 3, and allow it to work more effectively. As discussed with reference to FIG. 1, detectors 42 may preferably include motion sensors or other electromechanical transducers such as seismometers. Since such detectors can be shielded so that they do not detect any EM signal, they can provide a noise channel free of transmitted EM signal. This use of electromechanical transducers as EM noise channel detectors resulted from our discovery that hitting the side of a land drilling rig produces a response, i.e. noise, in an electrical field sensor. We believe that there are several mechanisms which explain why physical motion correlates to EM noise.

As any part of the drill rig 10 vibrates, it cuts the earth's magnetic field lines and thus by Faraday's law (induced EMF is proportional to rate of change of magnetic flux), creates an electric field. Where it is possible to complete an electric circuit, the electric field creates a current, and hence another magnetic field. Any time varying electric field creates a magnetic field and vice-versa. The fact that a current creates a magnetic field is simply a manifestation of this same phenomenon, but is distinguished in this case because the magnetic field arising directly from the current will generally be stronger than the magnetic field arising simply from a time varying electric field. Hence, any vibration can be expected to correlated with electric and magnetic noise.

Any joint between dissimilar metals will produce an electromotive force. As the rig 10 is stressed, the effects from joints of dissimilar metals on the rig will vary as the contact resistance changes. In addition, the rig itself can act as an antenna in picking up electromagnetic energy. Rectifying joints can demodulate high frequency radiation, resulting in lower frequency currents having a DC component being induced on the rig and acting as a noise source due to variations in the joint as the rig is stressed by vibration.

As a drillstring is rotated in the earth's magnetic field, currents are induced in the drillstring as a consequence of Faraday's law (induced EMF is proportional to rate of change of magnetic flux). The amount of current will vary as the contact of the drillstring and bit with the formation varies. This serves as both a source of electrical and magnetic interference and can be correlated with drillstring rotation, i.e. physical motion.

There is also some reason to expect that some of the noise will be correlated with flowing fluids. It is well known that a streaming fluid containing clay particles creates an electromotive force. Variations in flow will thus manifest themselves as variations in the electric field (and where it is possible for currents to flow, as variations in the magnetic field). See e.g. P. 525 of Physical Chemistry, Second Edition, William F. Sheehan,1970, Allyn and Bacon, Inc., Boston. This reference also mentions another effect known as the Dorn effect, which can produce a potential difference with a flowing fluid containing clay particles (e.g. drilling mud).

In addition, shale and most minerals conduct electricity. Thus, as the bit contacts the formation, an EMF is developed due to the dissimilar materials. The chemical action between the drilling mud, formation fluids and the drillstring is capable of creating an electromotive force which can be modulated by vibration. Thus, EM noise created by these electrical phenomena may correlate with vibration in the drill pipe 12.

Other types of electromechanical transducers can also provide an electrical signal representing mechanical forces correlated with these effects. While a vibration detector can detect motion in the drill rig 10, the motions will also cause variations in stress of the rig members which can be detected by a strain gauge connected to the rig. While flow lines may produce detectable vibrations, the flow and variations in the flow can also be detected by flow rate meters and pressure detectors coupled to the flow lines.

Figure 8:
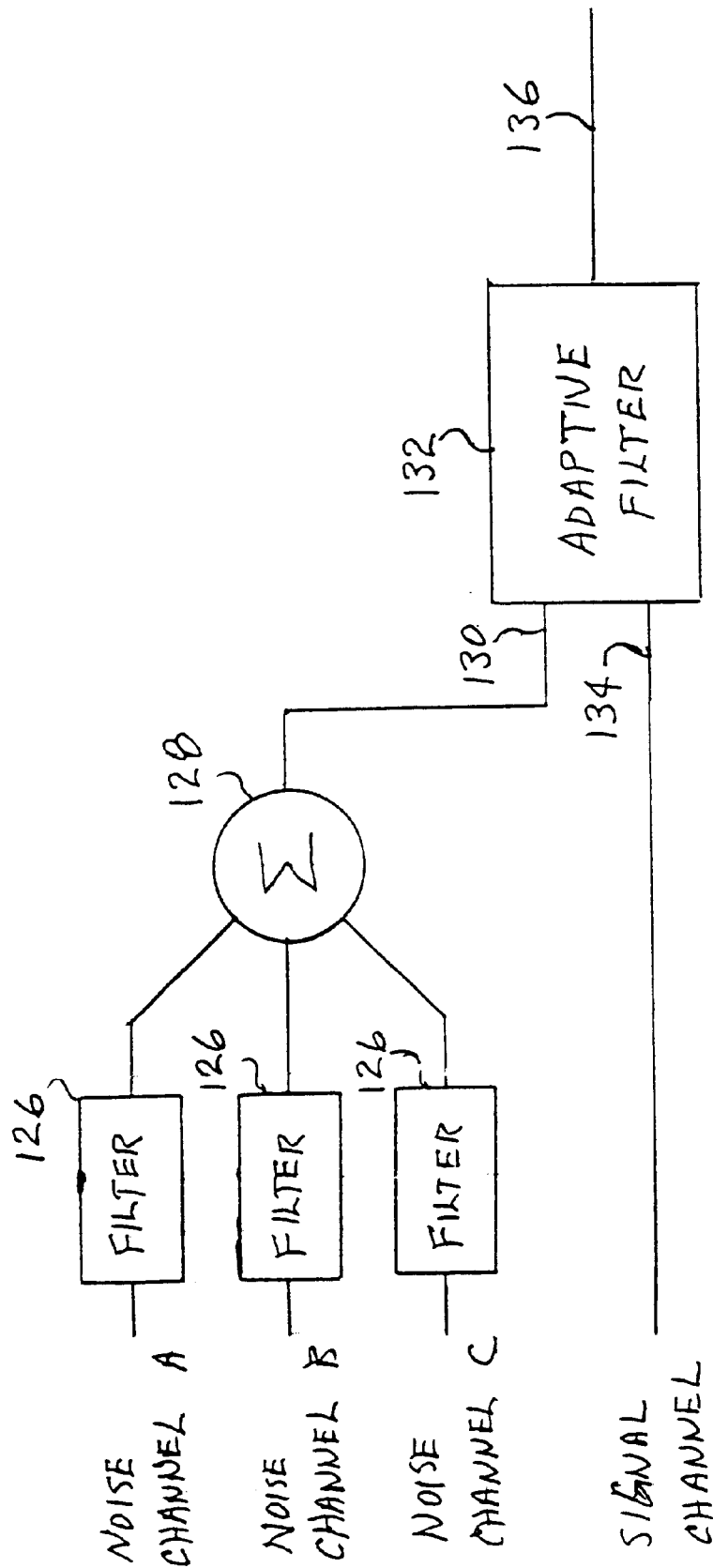
FIG. 8 is a block diagram of a system for combining multiple noise channels and removing the combined noise from a signal channel with an adaptive filter.
Figure 9:
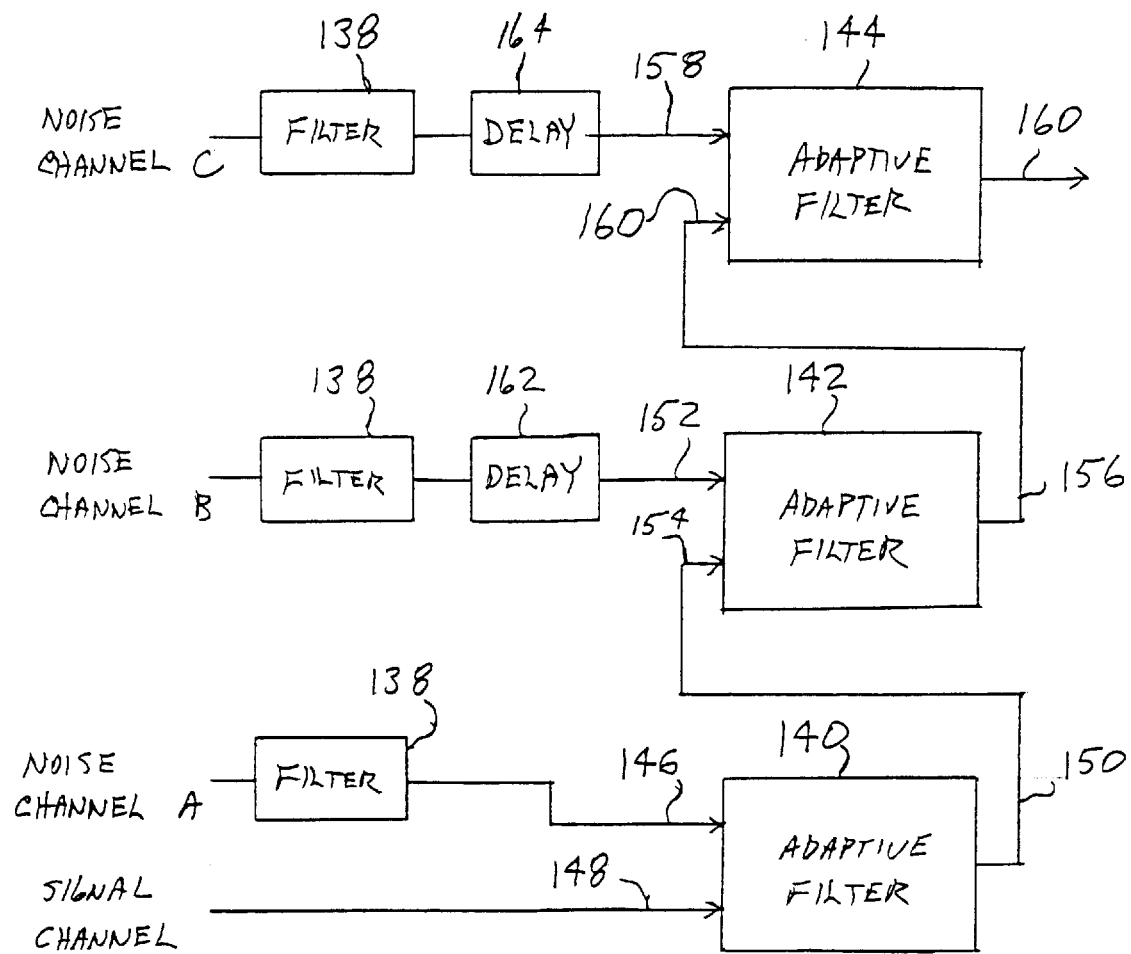
FIG. 9 is a block diagram of a system for removing multiple noise sources from a signal channel by use of multiple adaptive filters in series.

The noise canceling systems described above with respect to FIGS. 1 through 5 each have a single reference or noise channel input. The improved noise detectors described herein can provide a number of noise channels, each of which may desirably be removed from the signal channel. FIGS. 8 and 9 illustrate systems for removing multiple noise sources.

In FIG. 8, there is shown three noise channels, labeled A, B and C. There may, of course, be more than three noise channels. Each channel is coupled through a filter 126 to an adder 128 which provides a combined noise channel to the noise channel input 130 of an adaptive filter 132. Adaptive filter 132 may comprise the noise canceller circuitry 72 of FIG. 3. The signal channel is coupled to primary input 134 of adaptive filter 132. The signal with improved signal to noise ratio is provided on output 136.

Filters 126 preferably each include a bandpass filter to block any frequencies outside the operating range of the EM transmitter which generates the desired signal. They also preferably have transfer functions which adjust amplitude, and possibly phase, in accordance with the transfer function by which the various noise sources are coupled to the signal channel detector. These adjustments to the noise channels will help the adaptive filter 132 properly remove the noise from the signal channel.

FIG. 9 illustrates a system in which a separate adaptive filter is used to remove each noise source from the signal channel. In FIG. 9 three noise channels, A, B, and C are each coupled through filters 138 to separate adaptive filters 140, 142 and 144, each of which may comprise the noise canceller circuitry 72 of FIG. 3. In this case, the filters 138 would provide only band pass filtering to remove frequencies outside the operating range of the EM transmitter which generates the desired signal. It is not necessary to adjust amplitude and phase of the noise channels since the adaptive filters will operate on each one separately.

Noise channel A is coupled to the noise channel, or reference, input 146 of adaptive filter 140. The signal channel is coupled to the primary input 148. An improved signal from which the noise reference on noise channel A has been removed is provided on the output 150 of adaptive filter 140.

Noise channel B is coupled to the noise channel, or reference, input 152 of adaptive filter 142. The output 150 of adaptive filter 140 is coupled to the primary input 154 of adaptive filter 142. An improved signal from which the noise reference on noise channel B has been removed is provided on the output 156 of adaptive filter 142. Since filter 140 has already removed noise channel A from the signal, the improved signal on output 156 has both noise channels A and B removed.

Noise channel C is coupled to the noise channel, or reference, input 158 of adaptive filter 144. The output 156 of adaptive filter 142 is coupled to the primary input 160 of adaptive filter 144. An improved signal from which the noise reference on noise channel C has been removed is provided on the output 160 of adaptive filter 144. Since adaptive filters 140 and 142 have already removed noise channels A and B from the signal, the improved signal on output 160 has all three noise channels A, B and C removed.

While phase shifting of the noise channels is not needed in the normal sense, certain time delays are needed. In FIG. 9, noise channel B is coupled through a time delay 162. This time delay is set to compensate for the delay in the signal channel as it passes through the adaptive filter 140. This delay 162 keeps the noise channel B synchronized with the signal channel at the inputs 152 and 154 to adaptive filter 142. For digitized signals, this means that the delay 162 may be simply a one clock cycle delay.

In similar fashion, a delay 164 is provided for noise channel C. Delay 164 is set to compensate for the time delays through both adaptive filters 140 and 142. This delay 164 keeps the noise channel C synchronized with the signal channel at the inputs 158 and 160 to adaptive filter 144. For digitized signals, this means that the delay 164 may be simply a two clock cycle delay.

As noted above, there may be more than three noise sources having sufficient effect on the signal channel to warrant noise canceller apparatus. The FIG. 9 apparatus may be expanded to include a separate adaptive filter for each noise source.

In the FIG. 9 embodiment, it is preferred that the noise sources be ranked in order of significance, with the most significant usually being the noise having the greatest magnitude. The most significant should be coupled to the first adaptive filter. Thus, in FIG. 9 noise channel A would be the most significant and noise channel C would be the least significant. This arrangement removes the biggest noise source first and should improve the efficiency of the later adaptive filters which will remove smaller noises.

The significance of various noise sources will not be the same at all well sites. It may also change during the drilling of a well. It is therefore preferred to use an algorithm which actively selects the best order in which the noise channels should be removed from the signal. If significance is based only on magnitude, the algorithm can simply measure amplitude of each noise channel over a period of time and rank the noise channels by amplitude. The ranking can be done during an initial setup of the system and, if desired, repeated on a regular basis during drilling operations.

Not all noise channels will be of the same quality in terms of noise to signal ratio. The motion sensors discussed above may provide a noise channel containing essentially none of the transmitted signal. This would be a high quality noise channel because it allows a noise canceller to remove a noise without also reducing the signal level. Even if the magnitude of such a noise channel is less than other noise channels, it may be considered the most significant and coupled to the first adaptive filter since it will have no negative effect on the desired signal.

In similar fashion, some high amplitude noise channels may be rated lower in significance for other reasons. For example, the directional sensors disclosed herein may provide a signal channel which effectively excludes some noise sources. While a noise sensor may provide a strong noise channel for such a noise source, there is no need to provide the channel to a noise canceller since the signal channel does not contain that noise.

In most cases, the noise and signal channels will be digitized as shown in FIG. 3. All processing after the digitization is normally done by a computer programmed to perform the filtering, summing, subtracting, etc. functions. The algorithm for ranking noise channels will also be performed by software. This allows the ranking algorithm to be performed on a real time basis and allows reordering of the noise channels on a real time basis.

It is apparent that various changes can be made in the apparatus and methods disclosed herein, without departing from the scope of the invention as defined by the appended claims.

What we claim as our invention is:

1. Apparatus for removing noise generated by multiple sources from a received signal in a borehole electromagnetic telemetry system comprising;
   first and second noise sensors detecting first and second noise sources and providing first and second noise channels representative of said noise sources,
   first and second adaptive filters, having reference inputs coupled to said first and second noise channels respectively, and
   a first time delay unit coupling said second noise channel to said second adaptive filter reference input,
   said first adaptive filter having a primary input coupled to said received signal, and an output coupled to the primary input of said second adaptive filter.

2. Apparatus according to claim 1 wherein:
   said first time delay unit delays said second noise channel by about the time required for the received signal to propagate through said first adaptive filter.

3. Apparatus according to claim 2 further comprising:
   a third noise sensor detecting a third noise source and providing a third noise channel representative of said third noise source, a third adaptive filter, having a reference input coupled to said third noise channel, said third adaptive filter having a primary input coupled to the output of said second adaptive filter.

4. Apparatus according to claim 3 further comprising:

a second time delay unit coupling said third noise channel to said third adaptive filter reference input.

5. Apparatus according to claim 4 wherein:

said second time delay unit delays said third noise channel by about the time required for the received signal to propagate through said first and second adaptive filters.

6. Apparatus for removing noise generated by a plurality of noise sources from a received signal in a borehole electromagnetic telemetry system comprising;

a plurality of noise sensors detecting a plurality of noise sources, a plurality of adaptive filters, each having a reference input coupled to one of said noise sensors, and time delay units coupled to the reference inputs of the second and subsequent adaptive filters delaying said signals from the noise sources to maintain synchronization between said noise sources and said received signal, said adaptive filters coupled in series, with the first filter having a primary input coupled to said received signal and the last filter providing an improved signal from which noise from said noise sources has been substantially cancelled.

7. Apparatus for removing noise generated by a plurality of noise sources from a received signal in a borehole electromagnetic telemetry system comprising;

a plurality of noise sensors detecting a plurality of noise sources, a plurality of adaptive filters, each having a reference input coupled to one of said noise sensors, said adaptive filters coupled in series, with the first filler having a primary input coupled to said received signal and the last filter providing an improved signal from which noise from said noise sources has been substantially cancelled, said noise sources are ranked in order of significance, with the most significant coupled to the first adaptive filter and the least significant coupled to the last adaptive filter.

8. The apparatus of claim 7 wherein the order of significance is based on the amplitude of noise channels produced by said noise sensors.

9. The apparatus of claim 8 wherein the noise channel having the greatest amplitude is considered the most significant.

10. The apparatus of claim 7 wherein the order of significance is based on the magnitude of each noise source which is contained in the received signal.

11. The apparatus of claim 10 wherein the noise channel generating the greatest noise amplitude in the signal is considered the most significant.

12. The apparatus of claim 7 wherein the order of significance is based on the magnitude of signal which is contained in each noise channel.

13. The apparatus of claim 12 wherein:

the noise channel containing the least signal is considered the most significant.

* * * * *